Figure 1:
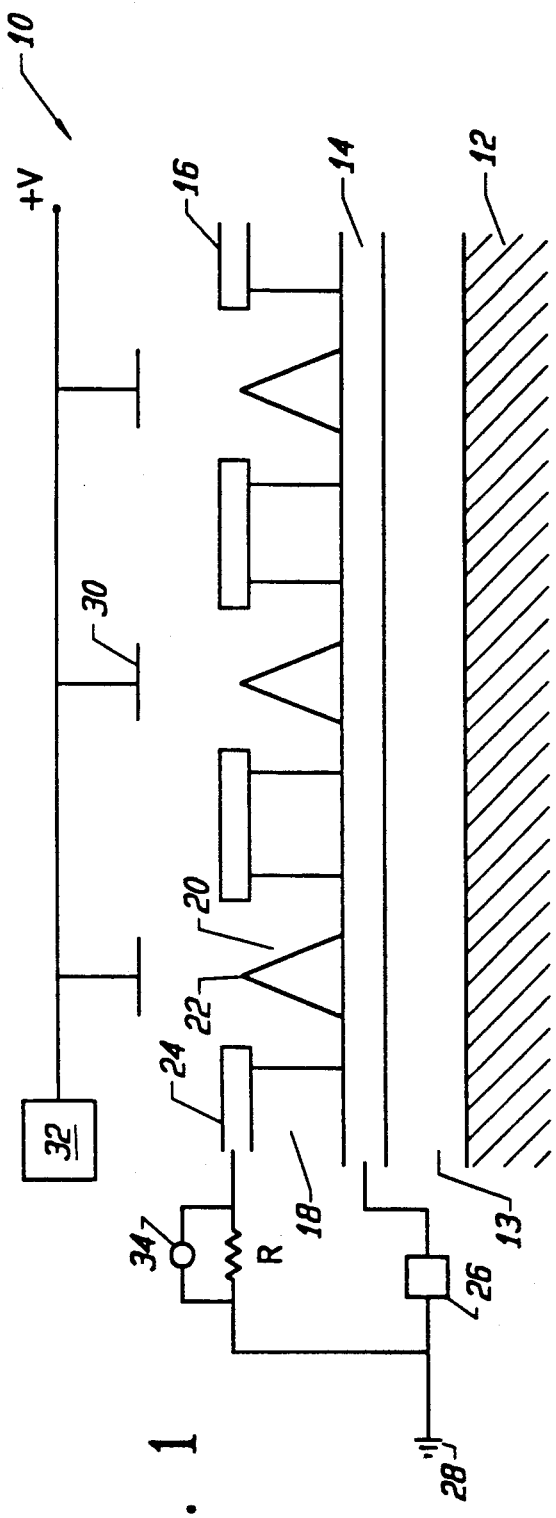

United States Patent [19]

MaCaulay et al.

[11] Patent Number: 5,089,292

[45] Date of Patent: Feb. 18, 1992

[54] FIELD EMISSION CATHODE ARRAY COATED WITH ELECTRON WORK FUNCTION REDUCING MATERIAL, AND METHOD

[75] Inventors: John M. MaCaulay; C. A. Spindt, both of Menlo Park; Christopher E. Holland, Redwood City; Ivor Brodie, Palo Alto, all of Calif.

[73] Assignee: Coloray Display Corporation, Fremont, Calif.

[21] Appl. No.: 556,647

[22] Filed: Jul. 20, 1990

[51] Int. Cl.$^5$ .................... B05D 5/12; H01J 19/06
[52] U.S. Cl. .................... 427/78; 427/77; 313/346 R; 313/336
[58] Field of Search .................. 313/309, 336, 346 R; 427/77, 78

[56] References Cited

U.S. PATENT DOCUMENTS

| | | | |
|---|---|---|---|
| 3,678,325 | 7/1972 | Nishida et al. | 313/346 |
| 3,755,704 | 8/1973 | Spindt et al. | 313/309 |
| 3,947,716 | 3/1976 | Fraser et al. | 427/77 |
| 4,379,250 | 4/1983 | Hosoki et al. | 427/77 |
| 4,722,852 | 2/1988 | Hoeberechts et al. | 427/38 |
| 4,736,135 | 4/1988 | Zwier et al. | 313/546 |
| 4,766,340 | 8/1988 | van der Mast et al. | 313/366 |
| 5,019,003 | 5/1991 | Chason | 427/77 |
| 5,023,110 | 6/1991 | Nomurd et al. | 427/77 |

Primary Examiner—John Niebling
Assistant Examiner—Kishor Mayekar
Attorney, Agent, or Firm—Flehr, Hohbach, Test, Albritton & Herbert

[57] ABSTRACT

A field emission cathode device is disclosed herein and includes an array of electron emitting cathode tips supported by a base electrode or electrodes, a gate electrode spaced from and associated with each tip, and dielectric material located between each gate electrode and the base electrode of its associated cathode tip for insulating the two from one another. The device also includes means for establishing an electric field between the gate electrodes and tips sufficient to cause the tips to emit current. In addition, each electron emitting cathode tip is coated with an electrically conductive material that reduces its electron work function. At the same time, the dielectric material which insulates the base electrodes and gate electrodes from one another is maintained sufficiently free of the electron work function reducing material so as not to result in any appreciable current leakage between the base and gate electrodes. The specific method of coating the cathode tips is also disclosed herein.

21 Claims, 2 Drawing Sheets

COATING THICKNESS

FIELD EMISSION CATHODE ARRAY COATED WITH ELECTRON WORK FUNCTION REDUCING MATERIAL, AND METHOD

The present invention relates generally to electron generating devices including electron emitting cathode tips, and more particularly to a specific method of simultaneously coating the surfaces of an array of electron emitting cathode tips with a layer of material which reduces the electron work function of each of the tips.

Devices which utilize field emission cathode tips to produce individual beams of current are well known in the art. One example may be seen in U.S. Pat. No. 3,755,704. There is disclosed in this patent a device including (1) an array of electron-emitting, field emission cathode tips, (2) a gate or accelerator electrode spaced from and cooperating with each of the tips for establishing an electric field between the gate electrodes and tips sufficient to cause the tips to emit current, and (3) dielectric material located between each gate electrode and its associated cathode tip for insulating the two from one another. Actually the dielectric material is physically located between the gate electrode and a base electrode that supports an associated cathode tip and serves to electrically insulate the gate electrode from the base electrode. However, for purposes of discussion herein, reference to the one base electrode may be omitted from time to time.

In an actual working embodiment of the prior art, the cathode tips are formed of a refractory metal such as molybdenum on a thin substrate or film of the same material. The gate electrode is also formed as a thin film of electrically conductive material such as molybdenum, while the dielectric insulation is a thin film of, for example, silicon dioxide. By applying a sufficiently large voltage across the cathode tips and their associated gate electrodes, the cathode tips can be caused to emit electrons from their surfaces.

A device of the type just described is especially suitable for use as part of a flat panel display, as is known in the art. Functioning in this manner, it would be particularly advantageous for current control using modern solid state circuits if the device could operate at relatively low voltages (below about 25 volts), that is, the voltages between the cathode tips and their associated gate electrodes required to cause the cathode tips to emit current. One way to reduce these "operating gate voltages" would be to coat each of the tips with a layer of material which reduces its electron work function. A known material for reducing the electron work function of electron emitting cathodes generally is cesium. See, for example, U.S. Pat. Nos. 4,722,852 and 4,766,340. In both of these cases, an electron work function reducing material is provided as a coating on an electron emitting cathode. There are also numerous publications describing the cesiation of thermionic and field emitters, respectively. However, to applicant's knowledge, there is no discussion in the literature or the prior art generally of the cesiation of thin film field emission micro-cathode arrays of the type described in, for example, the previously recited U.S. Pat. No. 3,755,704. One primary reason for this is that cesium, which is electrically conductive, is known to react with silicon dioxide, a typical insulator between the cathode tips and their associated gate electrodes. This insulator is particularly advantageous for its high field breakdown properties. The reaction between the cesium and silicon dioxide can, in turn, lead to unacceptable amounts of current leakage between the cathode tips (actually its base electrode) and gate electrodes.

In view of the foregoing, it is an object of the present invention to provide a technique for simultaneously coating the surfaces of an array of electron emitting cathode tips with a layer of material which reduces the electron work function of each of the tips.

A more particular object of the present invention is to so coat an array of electron emitting cathode tips which form part of an overall thin film field emission micro-cathode array.

An even more specific object of the present invention is to provide the last-mentioned method in which the electron work function of each of the tips is reduced to the lowest possible level (i.e. requiring a lowest possible operating gate voltage) without resulting in unacceptable levels of leakage current between the tips (actually the base electrode or electrodes supporting the tips) and their associated gate electrodes.

As will be disclosed in more detail hereinafter, the particular method disclosed herein is designed to coat the surfaces of an array of electron emitting cathode tips with a layer of material of pre-established thickness for reducing, preferably to the lowest possible, the electron work function of each of the cathode tips. In accordance with this method, the array of cathode tips, actually the entire device including the tips, is placed in a vacuum chamber. Thereafter, the vapor of the electron work function reducing material, for example, cesium, is introduced into the vacuum chamber in an amount sufficient to place a coating of the material on each tip. In accordance with the present invention, the amount of vapor within the chamber (both introduced into and withdrawn from the chamber) is controlled in a particular way in order to provide a pre-established thickness of the coating material on the cathode tips. In an actual working, preferred embodiment of the present invention, as the electron work function reducing material, in vapor form, is introduced into and withdrawn from the vacuum chamber, an operating gate voltage is applied to at least one of the cathode tips sufficient to cause that tip to emit current. The thickness of the coating material on the tips is established by monitoring the applied voltage/emission current characteristics of the one (or more) tips. In particular, the tips are coated with an electron work function reducing material to a thickness which minimizes the required operating gate voltage to cause the tips to emit a selected constant current.

Figure 2:
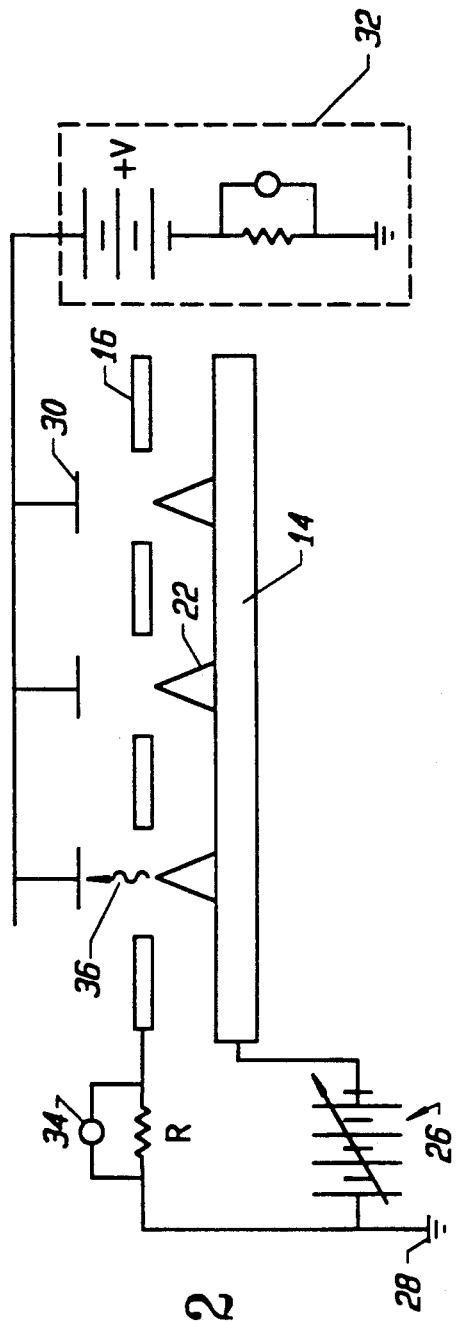
Figure 4:
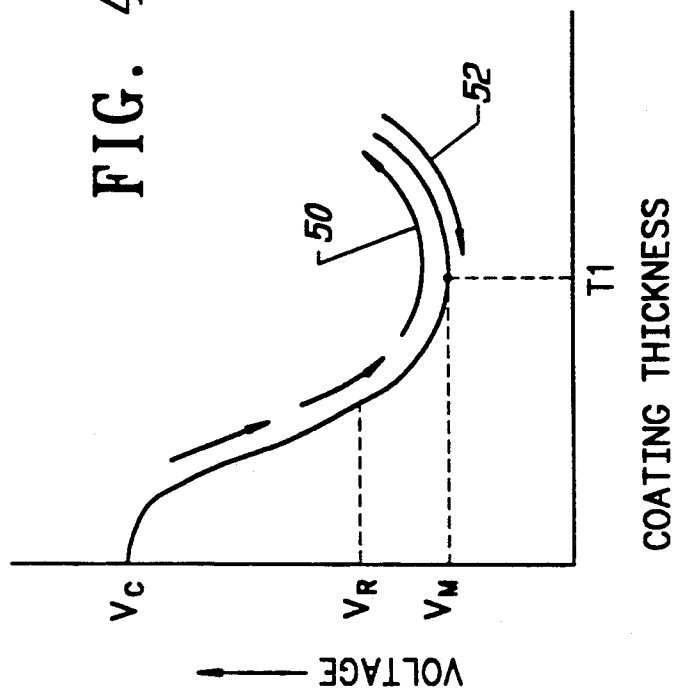
Figure 3:
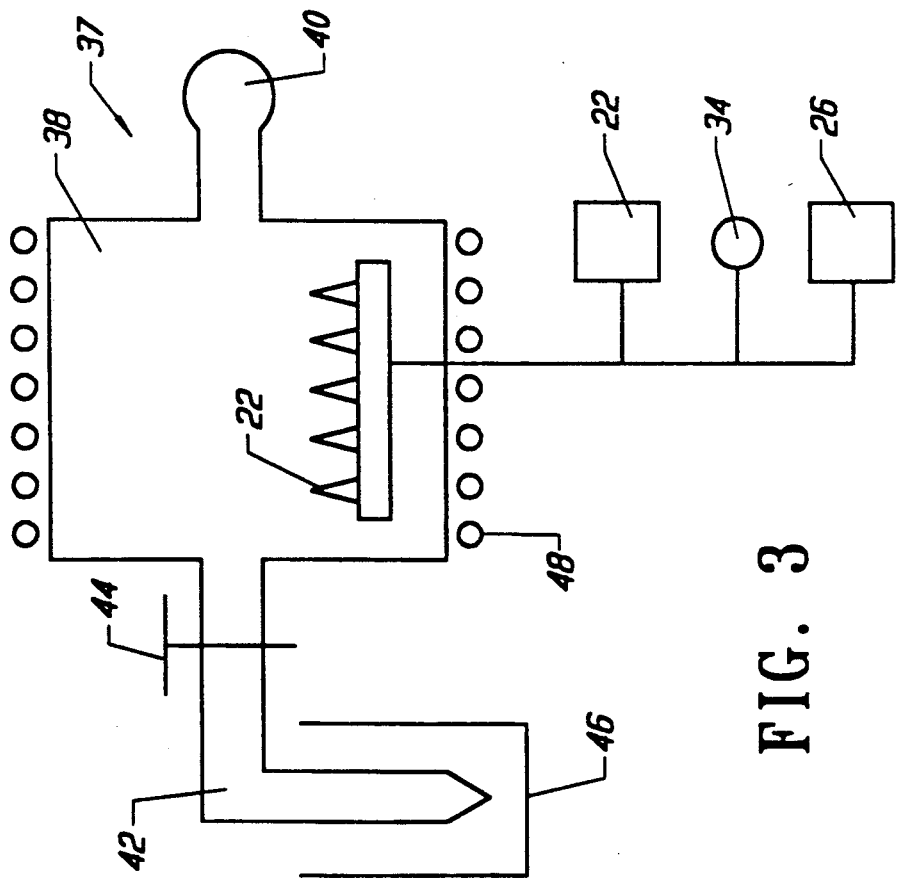

The present invention will be discussed in more detail hereinafter in conjunction with the drawings, wherein:

FIG. 1 is a diagrammatic illustration of a thin film, field emission micro-cathode device of the type to which the present invention pertains;

FIG. 2 diagrammatically illustrates part of an array of electron emitting cathode tips forming part of the device illustrated in FIG. 1 and shown in an operating circuit utilized in a process for coating all of the tips with a layer of material which reduces their electron work function;

FIG. 3 diagrammatically illustrates an overall system for carrying out the coating process referred to immediately above; and FIG. 4 graphically illustrates an electrical operating characteristic of the device shown in FIG. 1, which characteristic is monitored during the coating process carried out by the system depicted in FIG. 3.

Turning now to the drawings, wherein like components are designated by like reference numerals throughout the figures, attention is first directed to FIG. 1. This figure diagrammatically illustrates a thin film field emission micro-cathode device of the general type disclosed in previously recited U.S. Pat. No. 3,755,704. A device shown in FIG. 1 is generally designated by the reference numeral 10 and includes a dielectric base or substrate 12 which supports a silicon oxide layer 13 and on layer 13 a thin film or layer 14 of conductive material, for example, molybdenum or aluminum. A similar electrically conductive thin metal film 16 or layer is supported above and spaced from electrically conductive layer 14 by means of a layer of insulating dielectric material, for example, silicon dioxide, which is disposed between the two.

As illustrated in FIG. 1, both the thin layer 16 and the dielectric layer 18 include a series of openings 20, each of which accommodates an electron emitting cathode tip 22 extending up from thin layer 14 which serves as an electrically conductive base electrode for the tips. Note that the upper most ends of the cathode tips are located in close proximity to associated circumferential edges 24 defined by the openings 20 in layer 16. In actual operation, each of these circumferential edges serves as a gate electrode in association with an adjacent cathode tip. As is well known, when a sufficiently large electric field is applied between the cathodes and their associated gate electrodes, the cathode tips will emit current. As indicated previously, the amount of voltage that must be applied to the cathode tips to cause the latter to emit a given amount of current it is dependent upon the electron work function of the tips. By coating the tips with cesium or a similar material, their electron work function can be reduced. By appropriately selecting the thickness of the coating, this reduction can be maximized, that is, the applied voltage for a given emission current can be minimized.

Still referring to FIG. 1, electrically conductive thin film or layer 14 is shown connected to a variable direct current voltage source 26, although it could be driven in an alternating current mode. At the same time, thin film or layer 16 is shown grounded at 28. For reasons to be discussed below, a resistor R is connected in circuit between electrically conductive layer 16 and ground 28. As further illustrated in FIG. 1, overall device 10 includes a single common anode (not shown) or a series of anodes 30 (as shown), each of which is spaced from and in confronting relationship with an associated cathode tip 22. The single common anode or all of the anodes shown are maintained at a positive potential with respect to the voltage applied to the cathode tips so as to serve as targets or collectors for current emitted from the tips. In this regard, for reasons to become apparent below, a suitable and readily providable arrangement 32 is connected to the anodes 30 for monitoring the amount of emission current they collect from their associated cathode tips. At the same time, a similar arrangement 34 is connected across the resistor R for measuring the amount of leakage current, if any, which passes from layer 14 to layer 16 and then to ground 28 through resistor R, again for reasons to become apparent hereinafter.

FIG. 2 is an electrical schematic illustration of the overall device shown in FIG. 1. Operationally, a sufficient amount of voltage from supply 26 is applied to the cathode tips 22 by means of layer 14 in order to cause the cathode tips to produce a constant emission current 36 (see FIG. 2) between the tips and anodes 30, as monitored by means of arrangement 32. At the same time, if any leakage is present between the electrically conductive layers 14 and 16, it will produce a corresponding voltage across the resistor R which can be measured by means of arrangement 34.

Having described overall device 10 and the manner in which it can be operated, attention is now directed to a method designed in accordance with the present invention for simultaneously coating the surfaces of cathode tips 22 with a layer of material which reduces the electron work function of each tip. At the outset, the entire device 10, with the exception of its power supplies including voltage source 26 and +V and the monitoring arrangements 32 and 34, is located within apparatus 37 defining an ultra-high vacuum chamber 38 which is shown in FIG. 3. For purposes of simplicity, only the cathode tips 22 and their associated electrically conductive layer 14 are shown within the vacuum chamber.

The apparatus 37 defining vacuum chamber 38 is readily available in the art and includes a suitable vacuum pump 40 and an appendage 42 which contains a closure valve 44 and which extends into a cooperating vessel 46. For reasons to be discussed below, the chamber 38 is surrounded by suitable heating means, for example, an electric or hot water coil 48.

Having described apparatus 37, attention is now directed to the specific steps involved in simultaneously coating the surfaces of cathode tips 22 with a layer of cesium sufficient to minimize the amount of voltage applied to the tip in order to produce a given emission current 36. At the outset, with the cathode tips uncoated, the device is calibrated, that is, its operating gate voltage at the given emission current is established. This may be accomplished by varying the voltage supply 26 until the given emission current is reached, as indicated by means of monitoring arrangement 32 which may include a suitable visual display. At the same time, the arrangement 34 may also have a visual display indicating the amount of leakage current present between film layers 14 and 16. Assuming that there are no shorts between the two (which there should not be), no leakage current will be present. Assuming that to be the case, tips 22 are ready to be coated with a layer of cesium.

At this point, it should be noted that the voltage applied to cathode tips 22 necessary to produce the given emission current 36 varies with the thickness of the cesium coating on the tips in the manner graphically illustrated in FIG. 4 which depicts operating gate voltage as a function of coating thickness. With no coating on the cathode tips, the operating gate voltage remains at its calibrated level $V_C$. As the cesium layer begins coating the tips, the voltage decreases rapidly to a minimum level at a coating thickness T1. As the coating material becomes thicker, the voltage actually increases again, as illustrated.

With FIG. 4 in mind, overall device 10 is operated in the manner described above, within the chamber 38. At the same time, said cesium is placed in appendage 42 and the latter is gently heated (about 3 degrees above room temperature) to produce cesium vapor which is introduced into the chamber through appendage 42 in an amount sufficient to coat the cathode tips 22 with cesium to a thickness which causes the operating gate voltage shown in FIG. 4 to fall from its calibrated level $V_C$ to a clearly reduced level $V_R$ and then to its minimum level $V_M$. This can be monitored by means of arrangement 32 and voltage supply 26. At the point when the applied voltage reaches the level $V_R$, the chamber is heated by means of external heating coils 48 and the supply of cesium to the chamber is cut off. At the same time, while the valve 44 across appendage 42 is maintained in its opened position, the appendage is cooled to the temperature of liquid nitrogen which is placed in vessel 46. This causes any of the remaining cesium vapor within chamber 38 to be withdrawn from the chamber through the cold finger. While the cold finger preferably operates at this lower temperature, it will remove cesium vapor if it is maintained at slightly below room temperature, although not in as efficient a manner.

Even though the supply of cesium has now been cut off and, in fact, excess cesium vapor is being withdrawn from chamber 38, there is, nevertheless, sufficient vapor within the chamber to continue to coat the cathode tips 22. As a result, the cesium coating continues to thicken and the operating gate voltage continues to drop to its minimum level $V_M$ and then actually begins to increase, as indicated by arrow 50 in FIG. 4. By the time the voltage rises slightly above its minimum level, the heat applied to the chamber by means of coils 48 begins to vaporize the cesium off of the tips, causing the applied voltage to drop back down to its minimum level, as indicated by arrow 52. Even with continued heating, a sufficient amount of cesium remains on the tip so as to maintain the applied voltage at its minimum level $V_M$. It is at this point in time that the source of heat 48 is turned off and then valve 44 is closed when the apparatus, excepting the appendage, reaches room temperature.

During the process just described, it should be apparent that some of the cesium vapor does, indeed, coat the exposed surfaces of silicon dioxide layer 18. If this coating becomes too thick, it will produce a short circuit between the electrically conductive layers 14 and 16 along the edge of layer 18 defining its associated aperture 20. Therefore, as the process of coating the cathode tips with cesium is carried out, the leakage current between layers 14 and 16 is monitored by means of arrangement 34. So long as the process described above is operated within acceptably low leakage current levels, as monitored by means of arrangement 34, the process above can be carried out successfully.

It is to be understood that the present invention is not limited to the utilization of cesium. Other electron work function reducing materials such as barium and also thorium, strontium, sodium, and potassium can be utilized. Moreover, the present invention is not limited to the utilization of an array of electron emitting cathode tips but rather contemplates the utilization of a single tip or a small test array and the utilization of cathode tips other than those associated with thin film field emission micro-cathode devices. Further, while the process described herein has contemplated vapor deposition of cesium other physical deposition techniques may be utilized such as a sputtering technique, as well as known chemical deposition techniques.

In an actual working embodiment, a thin film device 10 has been provided in which the calibrated applied voltage $V_C$ was 82 V for a given emission current of 1 $\mu A$. After being subjected to the method disclosed herein, the applied voltage was reduced to a minimum voltage $V_M$ of 26 V while the leakage current remained at an acceptably low level of $<<0.1$ $\mu A$.

Attention is now directed to a modification to the process described.

A surface layer containing cesium, silver and oxygen prepared using various recipes has heretofore been established as producing a very low work function surface for photoelectric emission. An additional step has been added to the present cathode cesiation process to take advantage of this fact. Specifically, a thin layer of silver metal (approximately 50 angstroms) is deposited on an "as produced" thin film field emission micro-cathode array, that is, before cesiation. This is done in a vacuum chamber using an electron beam evaporator although a thermal evaporator can also be used. The coated cathode is then exposed to air, oxidizing the surface of the silver coating. The device is then placed in the cesiation apparatus 37, and cesiation is carried out, just as previously described.

Note that in order to have better control over the quality of the oxidized silver layer, the deposition of silver and oxidation by the controlled introduction of oxygen into the chamber, could all be done in the same chamber to be used for cesiation. Also note that it may be that thin layers of other materials, such as tungsten, may also be advantageous, as many exposure of such films to oxygen, or other gases such as fluorine.

What is claimed is:

1. A method of simultaneously coating the surfaces of an array of electron emitting cathode tips with a layer of material which reduces the electron work function of each of the tips, said method comprising the steps of:
   (a) placing said array of cathode tips in a vacuum chamber;
   (b) thereafter, while said array of cathode tips remains in said chamber, applying a voltage to at least one of the tips in said array sufficient to cause the one tip to emit current;
   (c) while said tip is being caused to emit current, introducing into said vacuum chamber a vapor of said electron work function reducing materials sufficient to place a coating of said material on each of the tips in said array including said one tip such that the applied voltage/emission current characteristics of said one tip varies to a limited extent with the thickness of its coating of said material; and
   (d) establishing the thickness of said coating of said electron work function reducing material on said one tip based upon its applied voltage/emission current as said one tip is coated with said one material.

2. The method according to claim 1 wherein the thickness of said coating materials on said one tip is established to provide a specific applied voltage/emission current characteristic.

3. The method according to claim 2 wherein said specific applied voltage/emission current characteristic is provided such that for a given current emitted from said one tip, the level of voltage applied to that tip is substantially at a minimum.

4. The method according to claim 3 wherein said step of applying a voltage to at least one of said tips to cause the one tip to emit current includes the step of maintaining the emission current constant while the applied voltage varies depending on the thickness of the coating materials on said one tip as the thickness of said coating material is established.

5. The method according to claim 4 wherein, at said constant emission current, said applied voltage first decreases to a minimum level and finally increases with increasing thickness in said coating material on said one tip, and wherein the amount of said vapor of said coating material within said chamber is regulated in a way which first causes said applied voltage to eventually begin to decrease, then increase and finally decrease again to a minimum fixed level, whereby to establish the thickness of said coating material on said one tip.

6. The method according to claim 5 wherein the regulation of said vapor within said chamber includes the steps of:
   (a) initially introducing said vapor into said chamber until the coating material on said tip is sufficiently thick to cause said applied voltage to eventually begin to decrease, at which time no further vapor is introduced into said chamber;
   (b) thereafter allowing the vapor within said chamber to remain therein until the coating material on said tip is sufficiently thick to cause said applied voltage to reach a minimum level and then increase;
   (c) thereafter heating said one tip for revaporizing some of its coating material to reduce the thickness of the coating material sufficient to decrease said applied voltage to said minimum level; and
   (d) as said tip is heated, withdrawing all of the vapor from said chamber.

7. The method according to claim 1 wherein said electron work function reducing material including cesium.

8. The method according to claim 7 including the step of coating each of said tips with a thin layer of silver before it is coated with said electron work function reducing material.

9. The method according to claim 1 wherein said applied voltage is applied to all of said tips in said array sufficient to cause each of said tips to emit current.

10. The method according to claim 1 wherein electron emitting cathode tips are field emission cathodes forming part of an overall device.

11. The method according to claim 10 wherein said overall device includes:
   (a) an anode electrode spaced from said cathode tips for receiving the current emitted from said tips;
   (b) a gate electrode spaced closer to each of said tips than said anode electrode and cooperating with each tip for establishing an electric field sufficient to cause said tips to emit said current;
   (c) a base electrode supporting said tips; and
   (d) dielectric material located between each gate electrode and the base electrode supporting its associated cathode for insulating the base and gate electrodes from one another.

12. The method according to claim 11 including the step of monitoring for leakage current between at least one of said gate electrodes and its associated cathode tip as said coating material is formed on said tip.

13. The method according to claim 12 wherein said dielectric material is silicon dioxide.

14. A method of simultaneously coating the surfaces of an array of electron emitting cathode tips with a layer of material which reduces the electron work function of each of the tips, said array of cathode tips forming part of an overall field emission cathode device which also includes base electrode means for supporting said tips, a gate electrode spaced from and cooperating with each tip for establishing an electric field between the gate electrodes and tips sufficient to cause the tips to emit current, and dielectric material located between each gate electrode and the base electrode means supporting its associated cathode tip for insulating the gate electrode and base electrode means from one another, said method comprising the steps of:
   (a) placing said device in a vacuum chamber;
   (b) introducing into said vacuum chamber a vapor of said electron work function reducing material sufficient to place a coating of said material on each of said cathode tips; and
   (c) controlling the amount of said vapor introduced into said chamber and withdrawing some of said vapor from said chamber, if necessary, in order to provide on said tips a coating of said material sufficient to reduce the electron work function of each tip without coating said dielectric material sufficient to cause any appreciable current leakage between the base electrode means supporting said tips and their associated gate electrodes.

15. The method according to claim 14 wherein said electron work function reducing material is cesium and including the step of coating said tips with a thin layer of silver before they are coated with cesium.

16. In a field emission cathode device including an array of electron emitting cathode tips supported by base electrode means, a gate electrode spaced from and cooperating with each tip for establishing an electric field between the gate electrodes and tips sufficient to cause the tips to emit current, and dielectric material located between each gate electrode and the base electrode means supporting its associated cathode tip for insulating the gate electrode and base electrode means from one another, the improvement comprising:
   (a) a coating of material on each of said cathode tips for reducing the electron work function of each tip, while said dielectric material is sufficiently free of said electron work function reducing material so as not to result in any appreciable current leakage between the base electrode means supporting said tips and their associated gate electrodes.

17. The improvement according to claim 16 wherein said electron work functions reducing material is cesium.

18. The improvement according to claim 17 wherein said dielectric material is silicon dioxide.

19. The improvement according to claim 16 wherein said device is a thin film field emission micro-cathode device.

20. The improvement according to claim 16 including a coating layer of silver on each of said tips under its coating of electron work function reducing material.

21. A method of simultaneously coating the surfaces of an array of electron emitting cathode tips with a layer of material which reduces the electron work function of each of the tips, said array of cathode tips forming part of an overall field emission cathode device which also includes base electrode means for supporting said tips, a gate electrode spaced from and cooperating with each tip for establishing an electric field between the gate electrodes and tips sufficient to cause the tips to emit current, and dielectric material located between each gate electrode and the base electrode means supporting its associated cathode tip for insulating the gate electrode and base electrode means from one another, said method comprising the steps of:
   (a) placing said device in a chamber;
   (b) providing within said chamber electron work function reducing material in an amount sufficient to place a coating of said material on each of said cathode tips; and
   (c) controlling the way in which said material is coated on said tips so as to reduce the electron work function of each tip without coating said dielectric material sufficient not cause any appreciable current leakage between the base electrode means supporting said tips and their associated gate electrodes.

* * * * *